(12) United States Patent
Ong et al.

(10) Patent No.: US 11,949,567 B2
(45) Date of Patent: *Apr. 2, 2024

(54) SAFEGUARDING ARTIFICIAL INTELLIGENCE-BASED NETWORK CONTROL

(71) Applicant: Ciena Corporation, Hanover, MD (US)

(72) Inventors: Lyndon Y. Ong, Sunnyvale, CA (US); David Côté, Gatineau (CA); Raghuraman Ranganathan, Bellaire, TX (US); Thomas Triplet, Manotick (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/971,709

(22) Filed: Oct. 24, 2022

(65) Prior Publication Data

US 2023/0046886 A1    Feb. 16, 2023

Related U.S. Application Data

(63) Continuation of application No. 16/270,667, filed on Feb. 8, 2019, now Pat. No. 11,483,212.

(51) Int. Cl.
*H04L 41/16*      (2022.01)
*G06F 30/27*      (2020.01)
(Continued)

(52) U.S. Cl.
CPC .............. *H04L 41/16* (2013.01); *G06F 30/27* (2020.01); *G06N 7/00* (2013.01); *G06N 20/00* (2019.01);

(Continued)

(58) Field of Classification Search
CPC ..... H04L 41/16; H04L 12/4641; G06N 20/20; G06N 20/00; G06N 7/00; G06F 30/27
See application file for complete search history.

(56) References Cited

U.S. PATENT DOCUMENTS 6,175,868 B1    1/2001 Lavian et al.
7,657,832 B1    2/2010 Lin
(Continued)

OTHER PUBLICATIONS

May 5, 2020, International Search Report and Written Opinion for International Patent Application No. PCT/US2020/016939.

*Primary Examiner* — Thu V Nguyen
*Assistant Examiner* — Angela M Widhalm de Rodriguez
(74) *Attorney, Agent, or Firm* — Baratta Law PLLC; Lawrence A. Baratta, Jr.

(57) ABSTRACT

Artificial Intelligence (AI)-based network control includes obtaining data from a network having a plurality of network elements; analyzing the data with one or more Machine Learning (ML) algorithms to determine one or more actions for network control; analyzing the determined one or more actions to determine any risks associated therewith; and one of allowing, modifying, and blocking the determined one or more actions based on the determined risks to safeguard the network. The risks can be based on one or more of (1) non-deterministic behavior AI inference which is statistical in nature, (2) unbounded uncertainty of the AI inference that can result in arbitrarily large inaccuracy on rare occasions, (3) unpredictable behavior of the AI inference in presence of input data that is different than data in training and testing datasets, and (4) malicious input data.

20 Claims, 8 Drawing Sheets

(51) Int. Cl.
  *G06N 7/00* (2023.01)
  *G06N 20/00* (2019.01)
  *G06N 20/20* (2019.01)
  *H04L 12/46* (2006.01)
(52) U.S. Cl.
  CPC ......... *G06N 20/20* (2019.01); *H04L 12/4641* (2013.01)

(56) References Cited

U.S. PATENT DOCUMENTS

| | | | |
|---|---|---|---|
| 8,296,822 B2 | 10/2012 | Becker et al. | |
| 8,306,938 B1 | 11/2012 | Howard et al. | |
| 8,456,984 B2 | 6/2013 | Ranganathan et al. | |
| 8,531,969 B2 | 9/2013 | Ong | |
| 8,606,105 B2 | 12/2013 | Ong | |
| 9,071,532 B2 | 6/2015 | Oltman et al. | |
| 9,774,502 B2 | 9/2017 | Ong | |
| 9,838,271 B2 | 12/2017 | Djukic et al. | |
| 10,015,115 B2 | 7/2018 | Ranganathan et al. | |
| 10,187,318 B2 | 1/2019 | Cote et al. | |
| 10,474,955 B1 * | 11/2019 | Santhanam | H04L 41/12 |
| 10,621,019 B1 * | 4/2020 | Faulhaber, Jr. | G06N 5/04 |
| 2004/0267395 A1 | 12/2004 | Discenzo et al. | |
| 2005/0152284 A1 | 7/2005 | Kotha et al. | |
| 2010/0036779 A1 | 2/2010 | Sadeh-Koniecpol et al. | |
| 2010/0114618 A1 * | 5/2010 | Wilcock | G06Q 10/06375 705/348 |
| 2015/0269508 A1 * | 9/2015 | Damboritz | G16H 40/20 705/2 |
| 2017/0235284 A1 * | 8/2017 | Watson | E21B 47/008 700/31 |
| 2017/0270432 A1 | 9/2017 | Sachdev et al. | |
| 2018/0091466 A1 | 3/2018 | Friedman et al. | |
| 2018/0248905 A1 | 8/2018 | Cóte et al. | |
| 2019/0102700 A1 | 4/2019 | Babu et al. | |
| 2019/0260795 A1 * | 8/2019 | Araiza | H04L 63/1416 |
| 2019/0281078 A1 * | 9/2019 | Eguiarte Salazar | H04L 63/162 |
| 2019/0294149 A1 * | 9/2019 | Kolouri | G05B 19/416 |
| 2020/0090033 A1 | 3/2020 | Ramachandran et al. | |
| 2020/0184253 A1 | 6/2020 | Butscher et al. | |

\* cited by examiner

SAFEGUARDING ARTIFICIAL INTELLIGENCE-BASED NETWORK CONTROL

CROSS-REFERENCE TO RELATED APPLICATION(S)

The present disclosure is a continuation of U.S. patent Application Ser. No. 16/270,667, filed Feb. 8, 2019, the contents of which are incorporated by reference in their entirety.

FIELD OF THE DISCLOSURE

The present disclosure generally relates to networking systems and methods. More particularly, the present disclosure relates to systems and methods for safeguarding Artificial Intelligence (AI)-based network control.

BACKGROUND OF THE DISCLOSURE

Currently, networks are controlled via various approaches including control planes, Software Defined Networking (SDN) controllers, Network Management Systems (NMS), and the like. As described herein, networks can include Layer 0 (photonic such as Dense Wavelength Division Multiplexed (DWDM), Layer 1 (Time Division Multiplexed (TDM) such as Optical Transport Network), Layer 2 (Packet, Multiprotocol Label Switching (MPLS), Layer 3 (Internet Protocol (IP)), and the like including combinations thereof. This conventional management plane approach relies heavily on operator input and control. There is a movement towards autonomous control, i.e., AI-based network control. However, there is no generally agreed solution related to the concerns of AI safety, especially with closed-loop Reinforcement Learning (RL) systems. Some thoughts related to solutions include the design of the AI system itself to incorporate some safeguards to prevent negative actions, use of multiple AI systems that check their actions against one other (for example, majority decision on the correct action to take), or testing of the AI system on a small scale domain until it has shown to not take negative actions over some lengthy testing time.

There are limitations of these current solutions as follows. First, the ability of the AI system design to avoid negative actions is dependent on how well the reward system encourages/discourages the selection of outcomes based on past outcomes. Second, each domain level AI system instance, albeit with the same trained model, could learn differently resulting in chaos with respect to service/network/slice behaviors. Third, the reward function may become neutral, i.e., bypassed, or ineffective in influencing outcomes as the AI system learns to expand the set of possible actions and/or outcomes. Fourth, the use of multiple AI systems does not eliminate the potential for multiple systems to agree on negative actions or to separately learn inappropriate behaviors. Fifth, testing of an AI system on a small scale environment does not avoid the potential that the behaviors of the AI system will either not work in the larger environment or that the AI system will modify its behaviors as it learns and eventually incorporates negative behaviors.

BRIEF SUMMARY OF THE DISCLOSURE

In an embodiment, an Artificial Intelligence (AI)-based network control system includes an AI system configured to obtain data from a network having a plurality of network elements and to determine actions for network control through one or more Machine Learning (ML) algorithms; a controller configured to cause the actions in the network; and a safeguard module between the AI system and the controller, wherein the safeguard module is configured to one of allow, block, and modify the actions from the AI system. The safeguard module can be further configured to obtain its own view of the network independent from the AI system and develop deterministic decisions which are used to compare with the actions from the ML algorithms. The safeguard module can be configured to allow the actions if the actions are within the deterministic decisions, block the actions if the actions are not within the deterministic decisions, and modify the actions based on overlap with the deterministic decisions. The safeguard module can be further configured to obtain operator input before the one of allow, block, and modify the actions, and wherein the operator input is provided to the ML algorithms for feedback therein. The safeguard module can be further configured to compare the actions from the AI system to a result from a deterministic algorithm. The safeguard module can be further configured to determine that the actions from the AI system do not violate predetermined conditions. The safeguard module can be further configured to interact with a second safeguard module associated with another network. The safeguard module can operate independent from the AI system.

In a further embodiment, an apparatus configured to safeguard an Artificial Intelligence (AI)-based control system includes a network interface communicatively coupled to i) an AI system configured to obtain data from a network having a plurality of network elements and to determine actions for network control through one or more Machine Learning (ML) algorithms and ii) a controller configured to cause the actions in the network; a processor communicatively coupled to the network interface; and memory storing instructions that, when executed, cause the processor to obtain the actions from the AI system via the network interface, analyze the actions, and one of allow, block, and modify the actions from the AI system to the controller. The memory storing instructions that, when executed, can further cause the processor to obtain a view of the network independent from the AI system, and develop deterministic decisions which are used to compare with the actions from the ML algorithms. The memory storing instructions that, when executed, can further cause the processor to allow the actions if the actions are within the deterministic decisions, block the actions if the actions are not within the deterministic decisions, and modify the actions based on overlap with the deterministic decisions. The memory storing instructions that, when executed, can further cause the processor to obtain operator input before the one of allow, block, and modify the actions, and provide the operator input to the ML algorithms for feedback therein. The memory storing instructions that, when executed, can further cause the processor to compare the actions from the AI system to a result from a deterministic algorithm. The memory storing instructions that, when executed, can further cause the processor to determine that the actions from the AI system do not violate predetermined conditions. The memory storing instructions that, when executed, can further cause the processor to interact with a second safeguard module associated with another network. The safeguard module can operate independent from the AI system.

In a further embodiment, a method includes, in a processing device having connectivity to i) an Artificial Intelligence (AI) system configured to obtain data from a network having a plurality of network elements and to determine actions for network control through one or more Machine Learning (ML) algorithms and ii) a controller configured to cause the actions in the network, obtaining the actions from the AI system via the network interface; analyzing the actions; and one of allowing, blocking, and modifying the actions from the AI system to the controller. The method can further include obtaining a view of the network independent from the AI system; and developing deterministic decisions which are used to compare with the actions from the ML algorithms. The method can further include allowing the actions if the actions are within the deterministic decisions; blocking the actions if the actions are not within the deterministic decisions; and modifying the actions based on overlap with the deterministic decisions. The method can further include obtaining operator input before the one of allow, block, and modify the actions; and providing the operator input to the ML algorithms for feedback therein.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for systems and methods for safeguarding Artificial Intelligence (AI)-based network control. The systems and methods can be independent of an AI system (software) and applicable to various different AI system. The systems and methods provide safeguards at various points in a control loop to protect decision making. Variously, the systems and methods include:

An ability to request human confirmation if a decision is ambiguous, if the AI-proposed action can affect mission-critical services, or if the proposed action has legal implications;

An ability to combine deterministic reactions to extreme situations of network behavior combined with the detailed but non-deterministic actions from machine learning AI;

An ability to apply and coordinate rollback changes to previous known stable states subject to policy/operational constraints;

An ability to apply safeguarding for a subset of network/service states, e.g., for a set of services belonging to a given network slice based on premium versus standard classes;

An ability to compartmentalize the application of AI system actions so as to mitigate the impact on other slices/services/resources;

An ability to quarantine offending Machine Learning (ML) models;

An ability to revert to previously stable ML inference models such as with weights, etc.;

An ability to exchange with peer AI systems of other domains in a service/slice context model state such as current ML model parameters (structure, weights, etc.) and valid/stable set of models in order to synchronize. Such peering policy might be enabled via the external safeguarding application.

The safeguards themselves can have "false positive" results in a sense they block something that should have gone through, but this can be improved via learning from human feedback. That is, human feedback for the safeguard can be used to improve the accuracy of ML models.

AI-Driven Adaptive Networks

Figure 1:
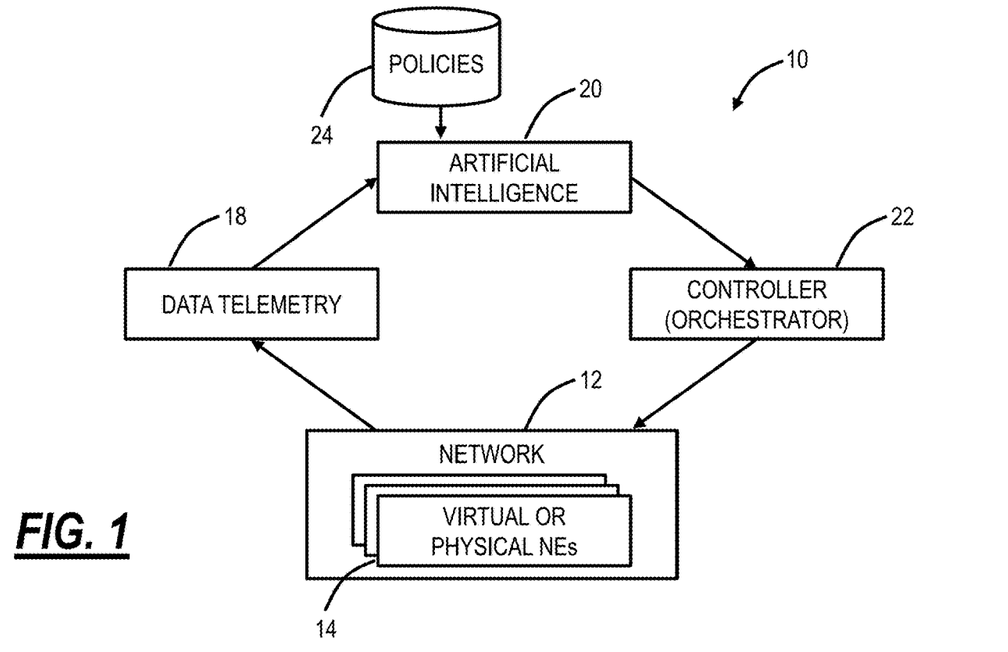
FIG. 1 is a block diagram of an AI-driven feedback loop for adaptive control of a network.

FIG. 1 is a block diagram of an AI-driven feedback loop 10 for adaptive control of a network 12. The network 12 includes network elements 14 which can be physical and/or virtual network elements. The physical network elements can include switches, routers, cross-connects, add-drop multiplexers, and the like. The virtual network elements can include Virtual Network Functions (VNFs) which can include virtual implementations of the physical network elements. The network 12 can include one or more layers including optical (Layer 0), TDM (Layer 1), packet (Layer 2), etc. In an embodiment, the network element 14 can be a nodal device that may consolidate the functionality of a multi-service provisioning platform (MSPP), digital cross-connect (DCS), Ethernet and Optical Transport Network (OTN) switch, DWDM platform, etc. into a single, high-capacity intelligent switching system providing Layer 0, 1, 2, and/or 3 consolidation. In another embodiment, the network element 14 can be any of an add/drop multiplexer (ADM), a multi-service provisioning platform (MSPP), a digital cross-connect (DCS), an optical cross-connect, an optical switch, a router, a switch, a Wavelength Division Multiplexing (WDM) terminal, an access/aggregation device, etc. That is, the network element 14 can be any system with ingress and egress signals and switching of packets, channels, timeslots, tributary units, wavelengths, etc. The network 12 can be viewed as having a data plane where network traffic operates and a control plane (or management plane) where control of the data plane is performed. The control plane provides data telemetry 18 during operation. The data telemetry 18 can include, without limitation, Operations, Administration, Maintenance, and Provisioning (OAM&P) data, Performance Monitoring (PM) data, alarms, and the like.

An Artificial Intelligence (AI) system 20 can receive the data telemetry 18, provide the data telemetry 18 as inputs to data-driven training and inference models, and provide results to a controller (or orchestrator) 22 for network control. The controller 22 is configured to modify/update the network elements 14 based on feedback from the AI system 20. The AI system 20 can be a server, network controller, SDN application, cloud-based application, etc. The AI system 20 is a processing device which receives inputs (the data telemetry 18) and provides outputs to the network controller 22 for automated control of the network 12. The AI system 20 can also be referred to as an ML inference engine. Various techniques for AI control, ML, etc. are contemplated. Some examples are described in commonly-assigned U.S. patent application Ser. No. 16/185,471, filed Nov. 9, 2018, and entitled "Reinforcement learning for autonomous telecommunications networks," U.S. Pat. No. 10,171,161, issued Jan. 1, 2019, and entitled "Machine learning for link parameter identification in an optical communications system," U.S. patent application Ser. No. 16/251,394, filed Jan. 18, 2019, and entitled "Autonomic resource partitions for adaptive networks," and U.S. patent application Ser. No. 15/896,380, filed Feb. 14, 2018, and entitled "Systems and methods to detect abnormal behavior in networks," the contents of each are incorporated by reference herein.

The AI-driven feedback loops 10 can play an instrumental role in adaptive network systems. Such systems need response time, i.e., time to compute the probability of an outcome given input data, to be fast for identifying the optimal action to take to change network/service state. This is a complex decision needing to consider, as input data patterns, many network/service state, and other business policies 24.

Generally, two broad types of AI can be used to drive "closed loops" by the AI system 20, namely 1) supervised or unsupervised pattern-recognition algorithms can be used to understand what is happening in the network 12 (see U.S. patent application Ser. No. 15/896,380 noted herein), and 2) reinforcement learning can be used to decide what actions should be taken on the network 12 (see U.S. patent application Ser. No. 16/185,471 noted herein).

Figure 2:
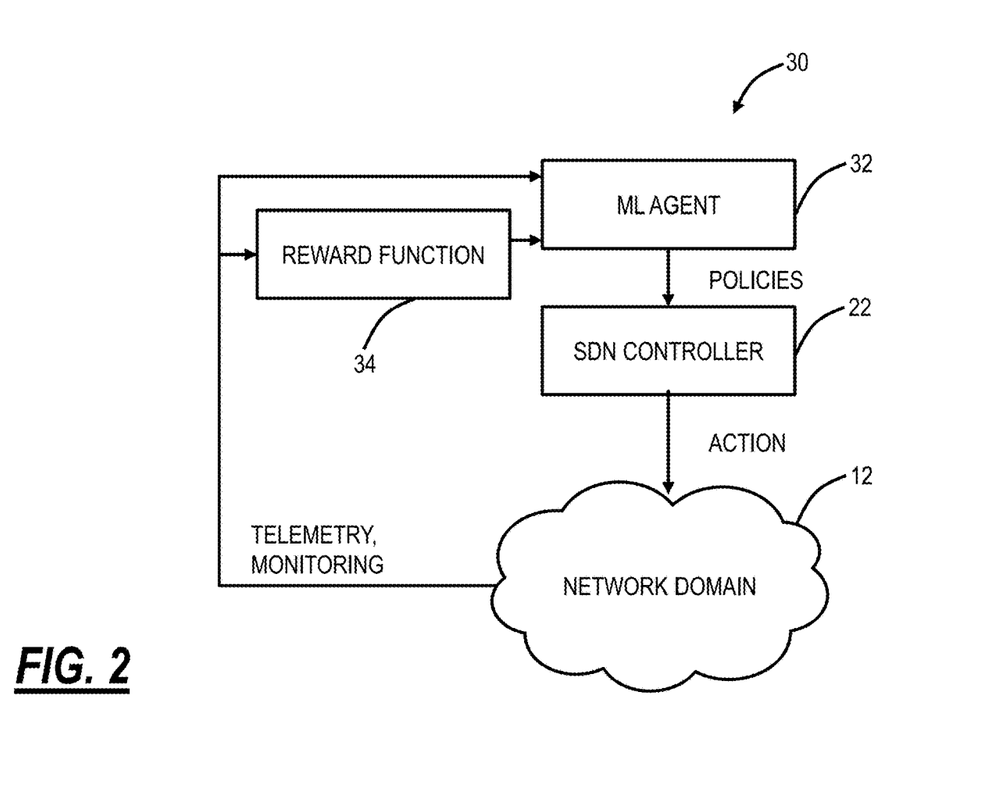
FIG. 2 is a block diagram of a Reinforcement Learning (RL) system.

FIG. 2 is a block diagram of a Reinforcement Learning (RL) system 30. Reinforcement Learning can be used for "closed loop" applications where there may not be a need for human supervision and the AI system 20 can independently derive state information from the environment and decide on actions to affect that environment, e.g., a service or resource instance in a given network domain. In FIG. 2, the RL system 30 includes the network 12 which provides telemetry and monitoring data to an ML agent 32 and to a reward function 34 which provides input to the ML agent 32. The ML agent 32 can be the AI system 20 and provides an interpreter function observing the environment via the telemetry and monitoring data for current state information and determining the actions required to achieve a target state. The reward function 34 is used by the AI system 20 to maximize the probability, and thus reinforcing behavior, of achieving the target state.

Typically, the RL system 30 is initially trained on a large data set in order to give it a base set of operational policies for business/service/network target states to invoke or maintain based on the state of the environment, then the RL system's 30 inference model continues to learn and refine its behavior as it is exposed to the real-world behaviors and observes the results of its actions there. In some cases, the RL system 30 may need to experiment with an available set of possible actions constrained by operational policies while attempting to find the optimal action. In some cases, the operational policies themselves could be refined, i.e., dynamic policy, based on observed current state as well as actions taken in previous attempts.

RL includes defining costs and rewards to quantify network actions, determining allowed network actions, and defining metrics describing a state of the network 12; obtaining network data to determine a current state based on the defined metrics; and determining one or more of the network actions based on the current state and based on minimizing the costs and/or maximizing the rewards. That is, RL includes rewards/costs which set the objective/goal, a state which defines where the network 12 currently is relative to the objective/goal, and network actions which are used to drive the state towards the objective/goal.

Other types of Machine Learning (ML) can be used to drive closed-loop network applications, notably: pattern-recognition and event-classification techniques such as Artificial Neural Networks (ANN) and others. In this case, a set of raw inputs from the telemetry and monitoring data can be turned into a higher-level insight about the network state, which in turn can be used to decide how to take actions to modify the network 12. For example, collections of performance monitoring data can be interpreted by an AI as: "there seems to be a congestion happening on link X affecting services ABC," "bandwidth allocated to service D should become under-utilized for the next 8 hours and could be used elsewhere," "behavior of device Y suggests a high risk of failure within next 2-3 days," etc. As a result, network policies could take automated actions such as re-route low-priority away from link X, re-allocate some of the service D bandwidth to other services EFG or re-route services away from device Y and open a maintenance ticket.

Risks Associated with AI-Driven Systems

While these types of ML have led to breakthroughs in AI capability such as unbeatable (by humans) chess, Atari, and Go-playing systems, or image recognition systems, there are concerns with using them in real-world deployments. Risks associated with pure data-driven and AI-driven systems include: 1) Non-deterministic behavior AI inference which is statistical in nature, 2) unbounded uncertainty of AI inference that can result in arbitrarily large inaccuracy on rare occasions, even it is very accurate in most cases, 3) unpredictable behavior of AI inference in the presence of input data that is very different than the data in training and testing datasets, and 4) the possibility to break the system by injecting malicious input data.

Figure 3:
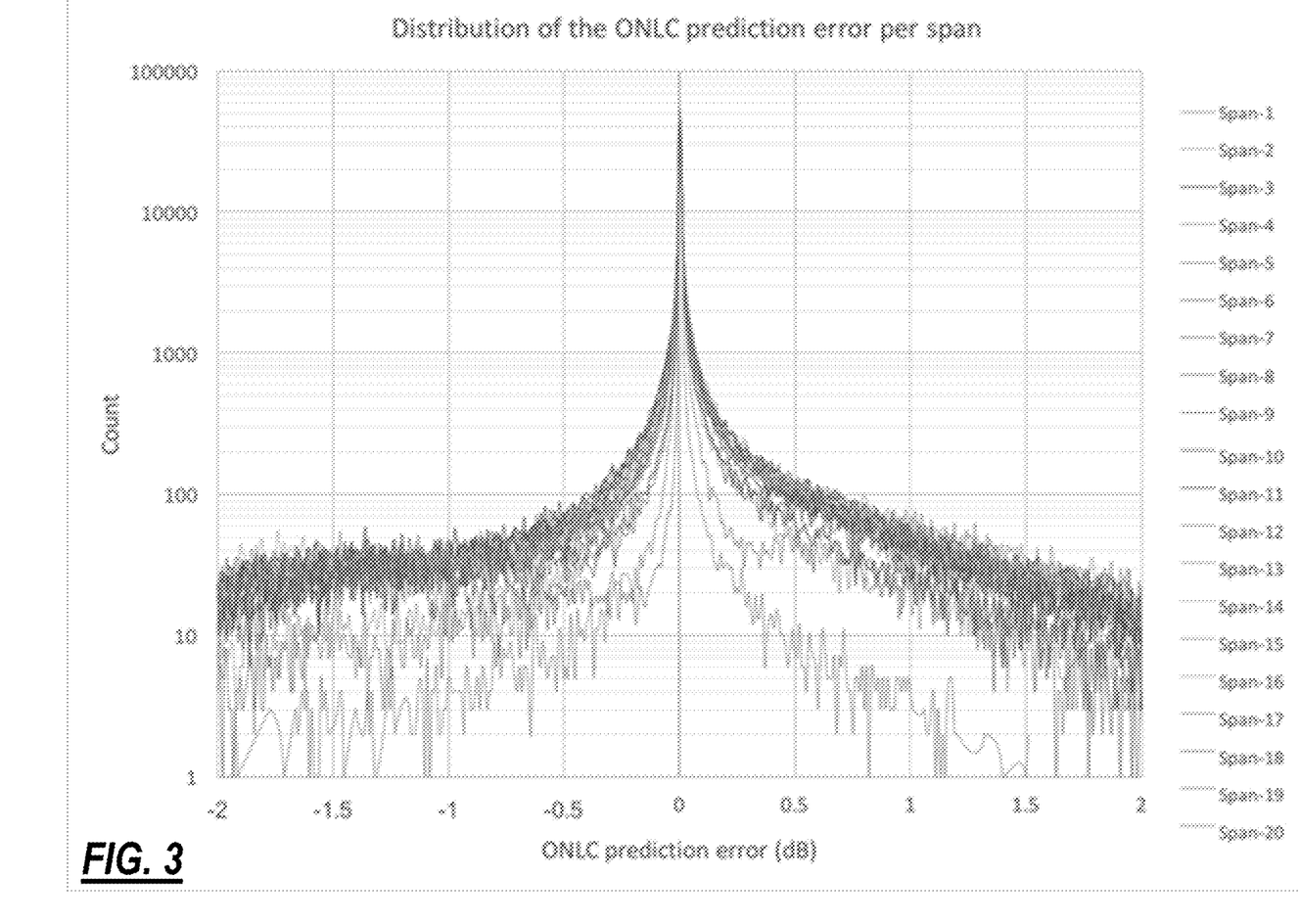
FIG. 3 is a graph of the distribution of Optical Non-Linear Coefficient (ONLC) prediction error per span.

Indeed, statistical ML algorithms typically provide very accurate predictions in the vast majority of situations but tend to have long tails of poor-accuracy in rare situations. For example, FIG. 3 is a graph of the distribution of Optical Non-Linear Coefficient (ONLC) prediction error per span. FIG. 3 shows an example of this behavior, where an ANN determines the value of ONLC with a resolution of less than 0.2 dB for more >99.9% of the cases but produces seemingly unbounded errors on rare cases. This can be problematic especially for, as example, network operator service/network control where an action may result in configuration changes across many network systems of one or more operator (service provider and partner operators) and/or technology (e.g., packet and optical layers) domains that supports the state for a given service. There must be no risk that potential AI mistakes could disrupt mission-critical services. Note, as described herein, network systems can include cloud systems as well including cloud systems with compute and storage resources (in addition to networking resources).

Additional potential issues with AI-driven networks identified include 1) actions may have unintended negative side effects, 2) a reward system may not reflect accurately the desired outcome, 3) training may not sufficiently reflect the costs of actions in the real world, 4) exploratory actions by the system while learning may lead to catastrophic results, 5) policies learned in training may not apply in the real-world environment, etc. As a result, there is a need for controls on the AI system 20 that prevent it from making disastrous decisions or causing the environment to evolve into suboptimal states that the AI system 20 believes are optimal based on its observations and learned behavior.

Safeguard Module

Figure 4:
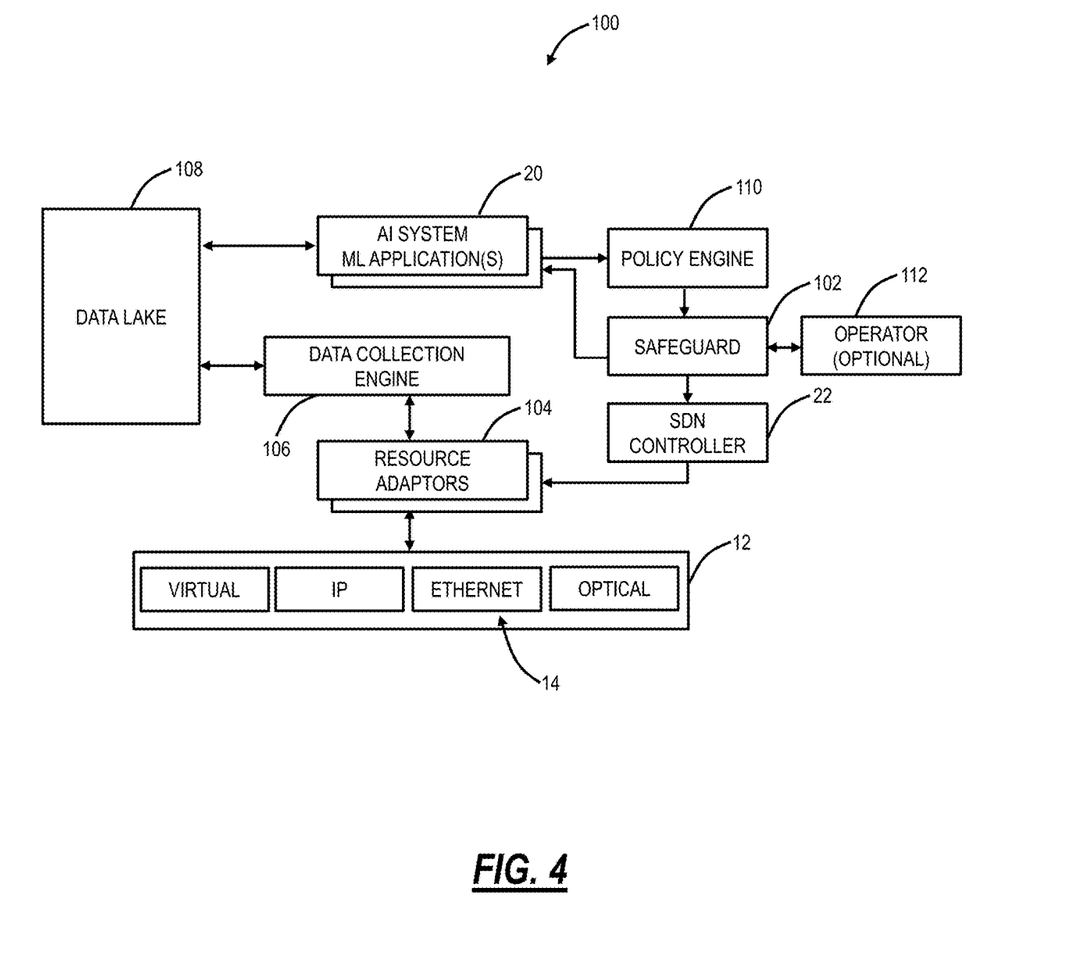
FIG. 4 is a block diagram of an expanded AI-driven system for adaptive control of a network and with a safeguard module.

FIG. 4 is a block diagram of an expanded AI-driven system 100 for adaptive control of a network 12 and with a safeguard module 102. The safeguard module 10 can reset or modify the actions of the AI system 20 if problems are detected with the environment, serving as a safeguard on the AI system 20. The AI-driven system 100 includes the network 12 with the various network elements 14 as well as cloud nodes or virtual private clouds, etc. The network 12 and the network elements 14 (as well as any cloud elements or other types of devices, components, etc.) are connected to Resource Adapters (RA) 104 for communication of telemetry and monitoring data. As described herein, a network element includes any device in a network or cloud that enables networking, compute, and/or storage resources. A data collection engine 106 is configured to process, consolidate, and store the telemetry and monitoring data from various different types of network elements 14 in a data lake 108.

The AI system 20 which can be one or more ML applications can utilize the data in the data lake 108 for automated control of the network 12, in conjunction with a policy engine 110. The safeguard module 102 is connected to the AI system 20, between the AI system 20 and the controller 22. Optionally, an operator 112 (human) can interface with the safeguard module 102. The controller 22, such as an SDN controller, is connected to the RA 104 for communication to the network elements 14. Advantageously, the AI-driven system 100 leverages accurate ML insights for 99.9% of situations but includes a deterministic safeguard module 102 to guarantee that ML accuracy remains bounded.

In an example operation, the safeguard module 102 takes inputs from a single ML algorithm implemented by the AI system 20. Here, the safeguard module 102 can look at the statistical uncertainties reported by the ML algorithm itself to flag ambiguous insights. For instance, if a classification is performed by an ANN whose last layer is Softmax, the safeguard module 102 can require that one category is clearly more probable than all the others and/or it can require a high probability threshold in order to validate a given insight. Optionally, the safeguard module 102 can request human confirmation from the operator 112 if a decision is ambiguous, e.g., if the AI-proposed action can affect mission-critical services or if the proposed action has legal implications.

Figure 5:
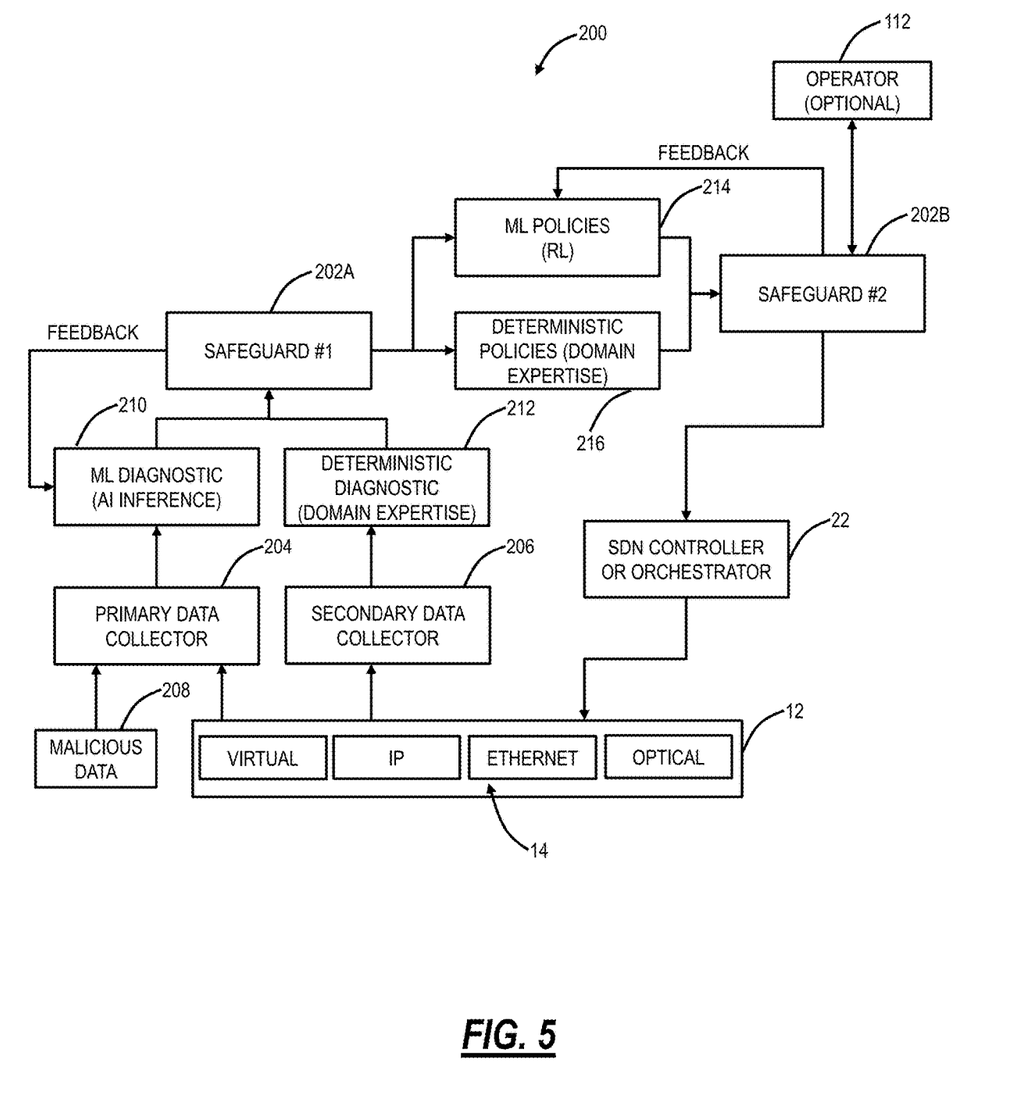
FIG. 5 is a block diagram of another expanded AI-driven system for adaptive control of a network and with multiple safeguard modules.

FIG. 5 is a block diagram of an expanded AI-driven system 200 for adaptive control of a network 12 and with multiple safeguard modules 202A, 202B. The AI-driven system 200 includes the network 12 with the various network elements 14. The network 12 and the network elements 14 are connected to data collectors 204, 206 for communication of telemetry and monitoring data. The data collectors can include a primary data collector 204 and a secondary data collector 206. Each data collector 204, 206 can be configured, similar to the RA 104, to communicate with the network elements 14. Also, it is possible for one of the data collectors 204, 206 to obtain malicious data 208.

In an embodiment, the primary data collector 204 can provide input to an ML diagnostic 210 (AI inference) module and the secondary data collector 206 can provide input to a deterministic diagnostic 212 (domain expertise) module. In the AI-driven system 200, there are several safeguard modules 202A, 202B. The safeguard module 202A can be for diagnostics about what is happening in the network 12, and the safeguard module 202B can be for actions that may be taken on the network 12. That is, the safeguard module 202A can maintain the integrity of the input to the AI system, and the safeguard module 202B can maintain the integrity of the actions of the AI system. The closed-loop automation system can protect itself from malicious fake-data attacks by using multiple independent data collectors 204, 206 and data sources. The safeguard module 202A can be after the diagnostics 210, 212 and before an ML policies 214 (RL) module and a deterministic policies 216 (domain expertise) module. The safeguard module 202B can be between the policies 214, 216 and the controller 22 which implements the actions in the network 12.

In this embodiment, each of the safeguard modules 202A, 202B takes inputs from at least two independent sources with no constraints on the number of inputs that could be used in a given implementation. For example, one input could be the current network state from the SDN controller 22 at the time (t+Δ) while the ML inference engine decided on the network state at the time (t) or earlier. The safeguard module 202A, 202B can request that all or a certain subset of input algorithms agree about insight to validate it and discard insights that do not get consensus. For example, a safeguard module 202 may consider an "aggressive" algorithm based on AI inference and a "conservative" algorithm based on deterministic domain expertise. Note, the various embodiments can include a single safeguard module 102, 202B as in FIGS. 4-5 or both safeguard modules 202A, 202B as in FIG. 5.

Figure 6:
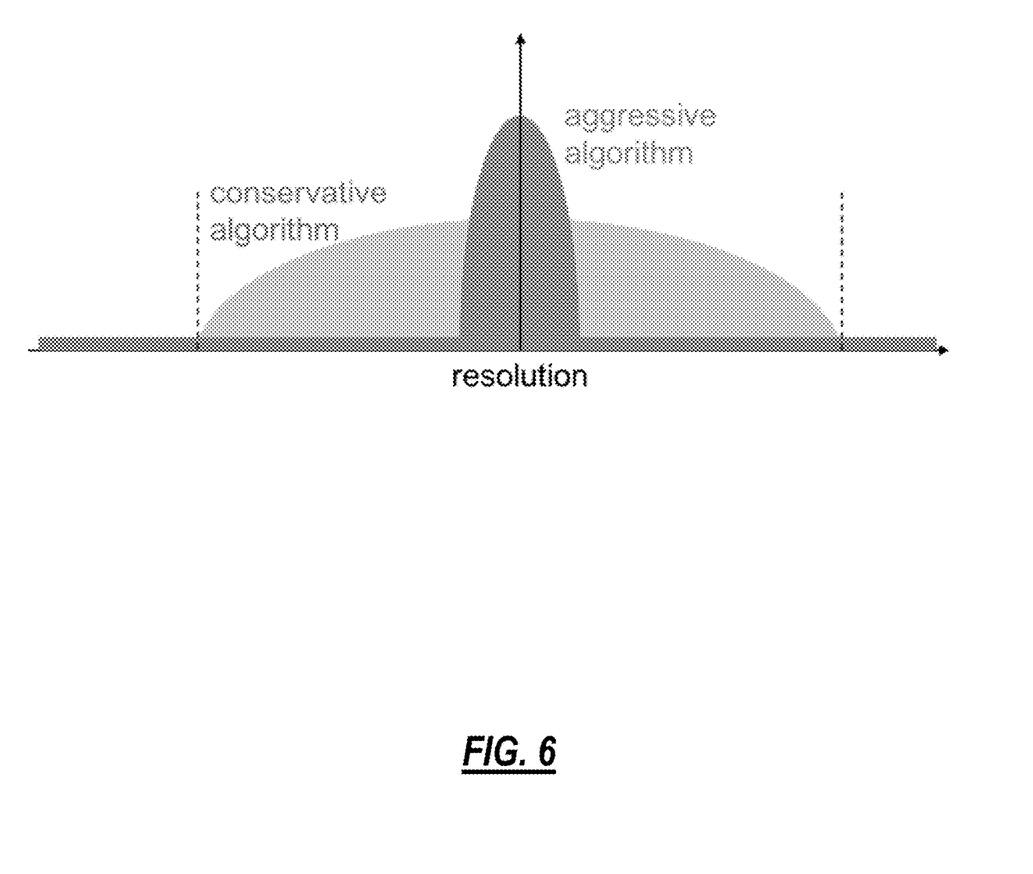
FIG. 6 is a graph of results between an "aggressive" algorithm based on AI inference and a "conservative" algorithm based on deterministic domain expertise.

FIG. 6 is a graph of results between an "aggressive" algorithm based on AI inference and a "conservative" algorithm based on deterministic domain expertise. As shown on FIG. 6, the aggressive algorithm (e.g., AI inference) generally produces most-accurate results but has unbounded uncertainties, while a conservative algorithm (e.g., deterministic subject-matter expertise) is generally less accurate but defines a bounded uncertainty. Specifically, the aggressive algorithm is the result of AI/ML whereas the conservative algorithm is the result of human expertise. The safeguard module 102, 202 can leverage the best of both worlds by using the aggressive results protected by the conservative uncertainty. Some examples are given in Table 1.

TABLE 1 examples of Safeguard outputs from two independent inputs.

| Task | Aggressive input (AI inference) | Conservative input (deterministic subject-matter) | Safeguard output |
|---|---|---|---|
| Classification | Event has type B | Event has type B, C or D | type B |
|  | Event has type A | Event has type B, C or D | None |
| Measurement | 12 +/− 0.1 dB | 15 +/− 4 dB | 12 dB |
|  | 4 +/− 0.1 dB | 15 +/− 4 dB | None |

In Table 1, the conservative algorithm is used by the safeguard module 102, 202 to bound the AI inference. In FIG. 6, as long as the AI inference result is within the deterministic subject-matter result, the safeguard module 102, 202 allows such result. Otherwise, it is blocked as being an unbounded result. Alternatively, the AI inference result can be modified if there is overlap between the deterministic subject-matter result and the AI inference result, such as in the first example in Table 1.

The different components in FIGS. 4-5 can be implemented as part of a network slice or a network domain. Additionally, implementations could use additional Virtual Machines (VMs)/Containers as part of service chain of functions to host the ML inference engine and safeguard module(s) for closed loop behaviors. Alternatively, an implementation can be as a safeguard-as-a-service with the ML inference engine and safeguard module(s) hosted in a private/public cloud. Various configurations and implementations are contemplated. Finally, it is possible to configure a safeguard module 102, 202 in passthrough mode to effectively disable its effect.

Figure 7:
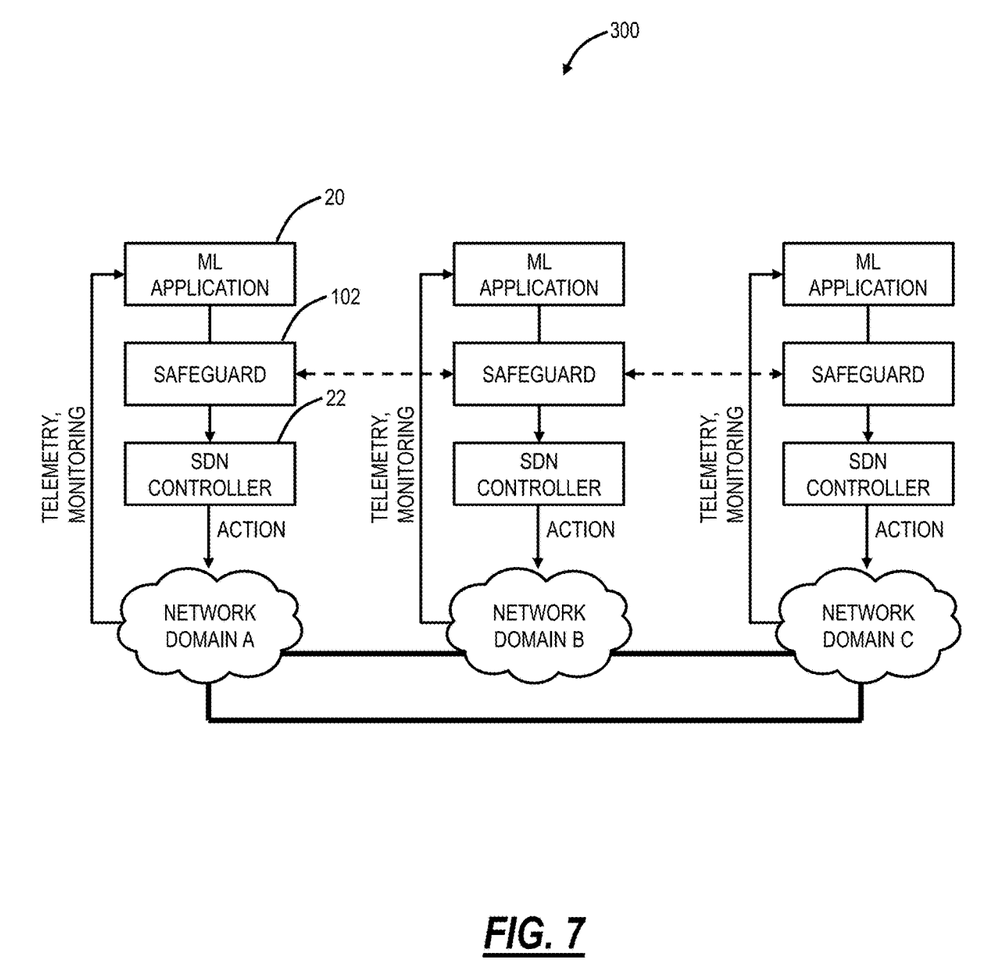
FIG. 7 is a block diagram of multi-domain use of a safeguard system.

FIG. 7 is a block diagram of multi-domain use of a safeguard system 300. When a safeguard client application is separate from the AI, it can be monitoring/safeguarding a single or may coordinate monitoring of a cluster of AI system instances that may be in one or multiple operator and technology domains. The safeguard system 300 includes the safeguard module 102 between an AI system 20 (ML application) and controller 22 which is connected to a network domain. Here, the safeguard module 102 can be implemented as a safeguard client application.

The safeguard client application may be using the same information about the environment or it may have access to additional information, for example, having a more global, shared view where a given AI system 20 instance might be focused on a particular domain within the global environment. Such a safeguard client application can also be a customer instance for a network slice that an AI system might be responsible for. This could allow a customer to monitor/safeguard the AI system including updating ML models in the network slice and coordinate AI Safety as needed.

Artificial Intelligence (AI)-Based Network Control System and Process

In an embodiment, an Artificial Intelligence (AI)-based network control system includes an AI system 20 configured to obtain data from a network 12 having a plurality of network elements 14 and to determine actions for network control through one or more Machine Learning (ML) algorithms; a controller 22 configured to cause the actions in the network 12; and a safeguard module 102, 202 between the AI system 20 and the controller 22, wherein the safeguard module 102, 104 is configured to one of allow, block, and modify the actions from the AI system 20 to ensure accuracy of the AI system 20 remains bounded. For example, the AI system 20 remains bounded when the results (actions) overlap results from the conservative or deterministic approach (FIG. 6).

Thus, the AI-based network control system includes an AI safeguard system with deterministic behavior to supervise and modify the behavior of the AI system 20 which could use Reinforced Learning or some other ML algorithm. The safeguard module 102, 202 can be further configured to obtain its own view of the network 12 independent from the AI system 20 and develop deterministic decisions which are used to compare with the actions from the ML algorithms. The safeguard module 102, 202 forms its own view of the state of the environment based on telemetry, alarms and other monitoring information it receives. It makes deterministic decisions based on this information to modify the future actions of the AI system 20.

Note, the safeguard module 102, 202 does not provide parallel functionality to the AI system 20 itself; it does not determine what network state should be transitioned to from a given state and input or try to optimize use of network resources, but only guards against adverse conditions developing in the network 12 based on predetermined rules and thresholds.

The safeguard module 102, 202 may, in fact, reduce the optimality that could be achieved by the AI system 20 without safeguards, however, in return, the network 12 is guaranteed to avoid certain conditions viewed as being catastrophic or extremely negative by the operator. Despite the potential for "false positive" alerts from the safeguard module 102, 202, the network operator may still prefer that the network 12 operate at less than optimum efficiency if the potential for major failure is reduced or eliminated.

The safeguard module 102, 202 includes an observer function that subscribes to receipt of network telemetry, alarms and monitoring as input to a deterministic algorithm in order to determine if an action from the AI system 20 exceeds safeguard thresholds, as well as a gating function that can intercept and either modify or drop action requests from the AI system 20 before they go out to network elements, request human intervention and if supported by the AI system can introduce more global changes to the AI system 20 state and reward functions.

The safeguard module 102, 202 can be configured to allow the actions if the actions are within the deterministic decisions, block the actions if the actions are not within the deterministic decisions, and modify the actions based on overlap with the deterministic decisions. The safeguard module 102, 202 can be further configured to obtain operator input before the one of allow, block, and modify the actions, and wherein the operator input is provided to the ML algorithms for feedback therein.

The safeguard module 102, 202 can be further configured to compare the actions from the AI system 20 to a result from a deterministic algorithm to ensure the actions do not exceed limitations. For example, the safeguard module 102, 202 can prevent network-affecting failures (e.g., loss of critical connectivity, overall congestion) and causing load on particular network elements 14 or sets of network elements 14 to exceed desired values. The safeguard module 102, 202 can be further configured to determine the actions from the AI system 20 do not violate predetermined conditions, e.g., disruption of known critical connectivity, The safeguard module 102, 202 can be further configured to interact with a second safeguard module associated with another network. In this interaction, the safeguard module 102, 202 can determine the AI system 20 requested action for one domain will introduce issues in a neighboring or remote domain and protect. The safeguard module 102, 202 may monitor a single or multiple AI systems 20 at the same time. It may have information available to it that is more global in nature than the information used by any single AI system 20. Optionally, the safeguard module 102, 202 is independent from the AI system.

The safeguard module 102, 202 may impact the future actions of the AI system 20 in a number of ways, for example:

forcing the AI system 20 to stop acting, and possibly causing a deterministic algorithm to be used instead;
causing the AI system 20 to roll back to an earlier state;
causing the AI system 20 to modify its selection for a learning model, for example, using a more stability-oriented or conservative reward function;
causing the AI system to revert to a pre-defined set of inference models (pruned as needed from its learning model); etc.

However, the safeguard module 102, 202 has advantages including the safeguard module 102, 202 can be independent of the AI system 20 and can be applied to many different AI systems 20 from different developments. The safeguard module 102, 202 does not need to be changed when the AI system 20 is replaced or upgraded. The safeguard module 102, 202 is designed at the start to deal with the global environment and does not need to be trained on a smaller scale environment. The safeguard module 102, 202 does not need to be as complex or sophisticated as the AI system 20, which focuses on the best optimization of network resources.

Figure 8:
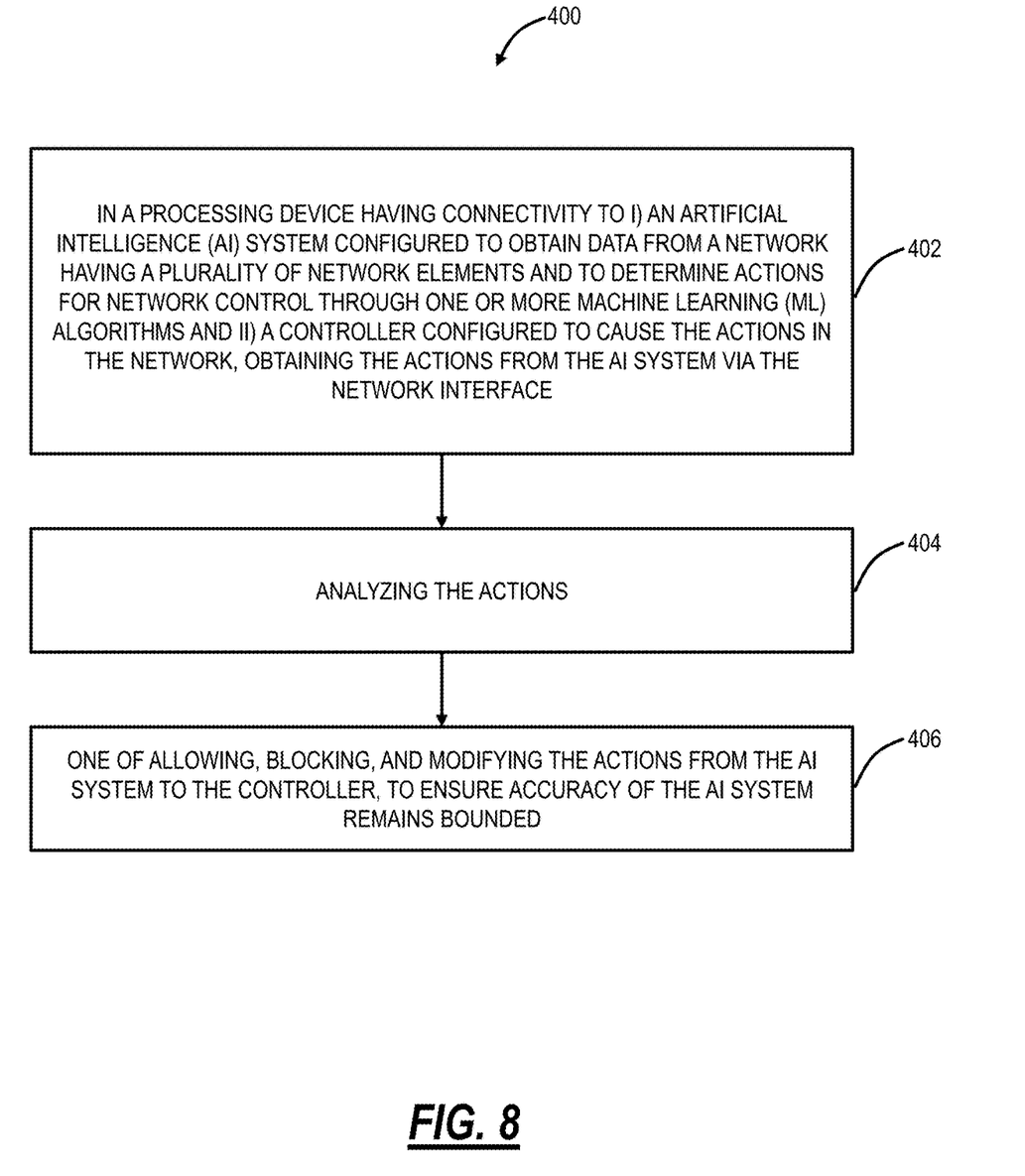
FIG. 8 is a flowchart of a process for AI-based network control.

FIG. 8 is a flowchart of a process 400 for AI-based network control. The process 400 includes, in a processing device having connectivity to i) an Artificial Intelligence (AI) system configured to obtain data from a network having a plurality of network elements and to determine actions for network control through one or more Machine Learning (ML) algorithms and ii) a controller configured to cause the actions in the network, obtaining the actions from the AI system via the network interface (step 402); analyzing the actions (step 404); and one of allowing, blocking, and modifying the actions from the AI system to the controller, to ensure accuracy of the AI system remains bounded (step 406).

The process 400 can further include obtaining a view of the network independent from the AI system; and developing deterministic decisions which are used to compare with the actions from the ML algorithms. The process 400 can further include allowing the actions if the actions are within the deterministic decisions; blocking the actions if the actions are not within the deterministic decisions; and modifying the actions based on overlap with the deterministic decisions. The process 400 can further include obtaining operator input before the one of allow, block, and modify the actions; and providing the operator input to the ML algorithms for feedback therein.

Processing Device

Figure 9:
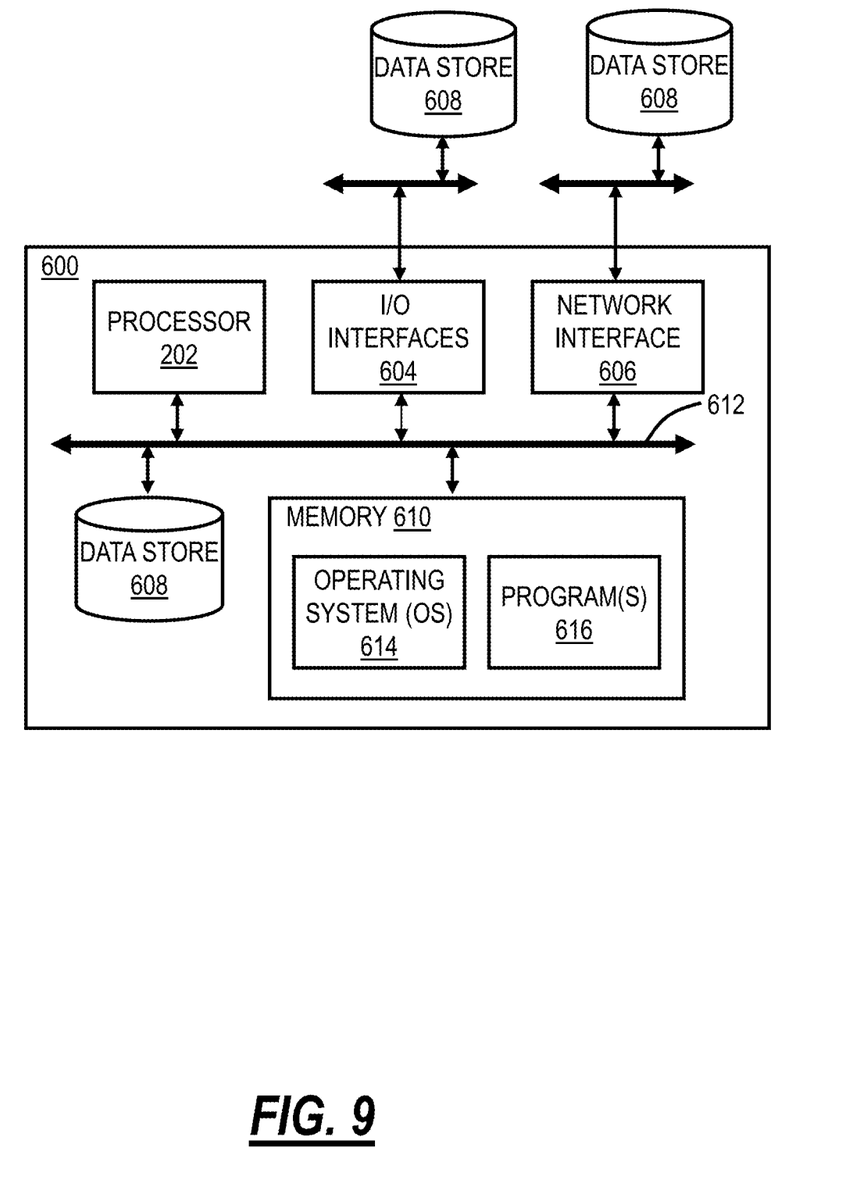
FIG. 9 is a block diagram of a processing device which may be used for realizing various components described herein.

FIG. 9 is a block diagram of a processing device 600 which may be used for various components described herein. For example, the AI system 20, the controller 22, the safeguard module 102, 202, etc. contemplate implementation through one or more processing devices 600. The processing device 600 may be a digital computer that, in terms of hardware architecture, generally includes a processor 602, input/output (I/O) interfaces 604, a network interface 606, a data store 608, and memory 610. It should be appreciated by those of ordinary skill in the art that FIG. 9 depicts the processing device 600 in an oversimplified manner, and a practical embodiment may include additional components and suitably configured processing logic to support known or conventional operating features that are not described in detail herein. The components (602, 604, 606, 608, and 610) are communicatively coupled via a local interface 612. The local interface 612 may be, for example, but not limited to, one or more buses or other wired or wireless connections, as is known in the art. The local interface 612 may have additional elements, which are omitted for simplicity, such as controllers, buffers (caches), drivers, repeaters, and receivers, among many others, to enable communications. Further, the local interface 612 may include address, control, and/or data connections to enable appropriate communications among the aforementioned components.

The processor 602 is a hardware device for executing software instructions. The processor 602 may be any custom made or commercially available processor, a central processing unit (CPU), an auxiliary processor among several processors associated with the processing device 600, a semiconductor-based microprocessor (in the form of a microchip or chip set), or generally any device for executing software instructions. When the processing device 600 is in operation, the processor 602 is configured to execute software stored within the memory 610, to communicate data to and from the memory 610, and to generally control operations of the processing device 600 pursuant to the software instructions. The I/O interfaces 604 may be used to receive user input from and/or for providing system output to one or more devices or components. User input may be provided via, for example, a keyboard, touchpad, and/or a mouse. System output may be provided via a display device and a printer (not shown). I/O interfaces 204 may include, for example, a serial port, a parallel port, a small computer system interface (SCSI), a serial ATA (SATA), a fibre channel, Infiniband, iSCSI, a PCI Express interface (PCI-x), an infrared (IR) interface, a radio frequency (RF) interface, and/or a universal serial bus (USB) interface.

The network interface 606 may be used to enable the processing device 600 to communicate on a network, such as to network elements, NMSs, SDN controllers, to various devices described herein, etc. The network interface 606 may include, for example, an Ethernet card or adapter (e.g., 10 BaseT, Fast Ethernet, Gigabit Ethernet, 10 GbE) or a wireless local area network (W LAN) card or adapter (e.g., 802.11a/b/g/n/ac). The network interface 606 may include address, control, and/or data connections to enable appropriate communications on the network. A data store 608 may be used to store data. The data store 608 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 608 may incorporate electronic, magnetic, optical, and/or other types of storage media. In one example, the data store 608 may be located internal to the processing device 600 such as, for example, an internal hard drive connected to the local interface 612 in the processing device 600. Additionally, in another embodiment, the data store 608 may be located external to the processing device 600 such as, for example, an external hard drive connected to the I/O interfaces 204 (e.g., SCSI or USB connection). In a further embodiment, the data store 608 may be connected to the processing device 600 through a network, such as, for example, a network attached file server.

The memory 610 may include any of volatile memory elements (e.g., random access memory (RAM, such as DRAM, SRAM, SDRAM, etc.)), nonvolatile memory elements (e.g., ROM, hard drive, tape, CDROM, etc.), and combinations thereof. Moreover, the memory 610 may incorporate electronic, magnetic, optical, and/or other types of storage media. Note that the memory 610 may have a distributed architecture, where various components are situated remotely from one another but can be accessed by the processor 602. The software in memory 610 may include one or more software programs, each of which includes an ordered listing of executable instructions for implementing logical functions. The software in the memory 610 includes a suitable operating system (O/S) 614 and one or more programs 616. The operating system 614 essentially controls the execution of other computer programs, such as the one or more programs 616, and provides scheduling, input-output control, file and data management, memory management, and communication control and related services. The one or more programs 616 may be configured to implement the various processes, algorithms, methods, techniques, etc. described herein.

In an embodiment, the network interface 606 can be communicatively coupled to i) an AI system configured to obtain data from a network having a plurality of network elements and to determine actions for network control through one or more Machine Learning (ML) algorithms and ii) a controller configured to cause the actions in the network 12. The memory storing instructions that, when executed, cause the processor to obtain the actions from the AI system via the network interface, analyze the actions, and one of allow, block, and modify the actions from the AI system to the controller, to ensure accuracy of the AI system remains bounded.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A non-transitory computer-readable medium comprising instructions that, when executed, cause one or more processors to perform Artificial Intelligence (AI)-based network control comprising steps of:
    obtaining data from a network having a plurality of network elements;
    analyzing the data with one or more Machine Learning (ML) algorithms to determine one or more actions for network control where the one or more actions cause a configuration change across any of the plurality of network elements, wherein the network and the plurality of network elements operate at one or more layers including optical, time division multiplexing (TDM), packet, and combinations thereof;
    analyzing the one or more actions that were determined by the ML algorithms to determine any risks associated therewith, prior to implementation of the one or more actions in the network; and
    one of allowing, modifying, and blocking the one or more actions based on the risks to safeguard the network,
    wherein the one or more ML algorithms determine the one or more actions via an AI inference, and wherein the risks are based on one or more of (1) non-deterministic behavior of the AI inference which is statistical in nature, (2) unbounded uncertainty of the AI inference that can result in arbitrarily large inaccuracy on rare occasions, (3) unpredictable behavior of the AI inference in presence of input data that is different than data in training and testing datasets, and (4) malicious input data.

2. The non-transitory computer-readable medium of claim 1, wherein the safeguarding is performed independently from the one or more ML algorithms.

3. The non-transitory computer-readable medium of claim 1, wherein the steps include
    applying the safeguarding to a subset of services in the network.

4. The non-transitory computer-readable medium of claim 1, wherein the steps include
    compartmentalizing the one or more actions so as to mitigate impact on any slices, services, and resources in the network.

5. The non-transitory computer-readable medium of claim 1, wherein the steps further include
    quarantining any of the one or more ML algorithms based on the risks.

6. The non-transitory computer-readable medium of claim 1, wherein the steps further include
    causing any of the one or more ML algorithms to revert back to a previous state.

7. The non-transitory computer-readable medium of claim 1, wherein the data includes any of Operations, Administration, Maintenance, and Provisioning (OAM&P) data, Performance Monitoring (PM) data, and alarms.

8. The non-transitory computer-readable medium of claim 1, wherein one of the one or more ML algorithms include reinforcement learning.

9. A method comprising steps of:
    obtaining data from a network having a plurality of network elements;
    analyzing the data with one or more Machine Learning (ML) algorithms to determine one or more actions for network control where the one or more actions cause a configuration change across any of the plurality of network elements, wherein the network and the plurality of network elements operate at one or more layers including optical, time division multiplexing (TDM), packet, and combinations thereof;

analyzing the one or more actions that were determined by the ML algorithms to determine any risks associated therewith, prior to implementation of the one or more actions in the network; and one of allowing, modifying, and blocking the one or more actions based on the risks to safeguard the network, wherein the modifying includes changing the one or more actions responsive to the one or more actions having unbounded uncertainties and there being overlap with a deterministic result.

10. The method of claim 9, wherein the safeguarding is performed independently from the one or more ML algorithms.

11. The method of claim 9, wherein the steps include applying the safeguarding to a subset of services in the network.

12. The method of claim 9, wherein the steps include compartmentalizing the one or more actions so as to mitigate impact on any slices, services, and resources in the network.

13. The method of claim 9, wherein the steps further include
quarantining any of the one or more ML algorithms based on the risks.

14. The method of claim 9, wherein the steps further include
causing any of the one or more ML algorithms to revert back to a previous state.

15. The method of claim 9, wherein the data includes any of Operations, Administration, Maintenance, and Provisioning (OAM&P) data, Performance Monitoring (PM) data, and alarms.

16. The method of claim 9, wherein one of the one or more ML algorithms include reinforcement learning.

17. A non-transitory computer-readable medium comprising instructions that, when executed, cause one or more processors to perform Artificial Intelligence (AI)-based network control comprising steps of:

obtaining data from a network having a plurality of network elements;

analyzing the data with one or more Machine Learning (ML) algorithms to determine one or more actions for network control where the one or more actions cause a configuration change across any of the plurality of network elements, wherein the network and the plurality of network elements operate at one or more layers including optical, time division multiplexing (TDM), packet, and combinations thereof;

analyzing the one or more actions that were determined by the ML algorithms to determine any risks associated therewith, prior to implementation of the one or more actions in the network; and one of allowing, modifying, and blocking the one or more actions based on the risks to safeguard the network, wherein the modifying includes changing the one or more actions responsive to the one or more actions having unbounded uncertainties and there being overlap with a deterministic result.

18. The non-transitory computer-readable medium of claim 17, wherein the safeguarding is performed independently from the one or more ML algorithms.

19. The non-transitory computer-readable medium of claim 17, wherein the steps include
applying the safeguarding to a subset of services in the network.

20. The non-transitory computer-readable medium of claim 17, wherein the steps include
compartmentalizing the one or more actions so as to mitigate impact on any slices, services, and resources in the network.

* * * * *